United States Patent [19]

Cowley

[11] Patent Number: 4,943,981
[45] Date of Patent: Jul. 24, 1990

[54] DIVIDING MECHANISMS FOR FREQUENCY SYNTHESIZERS

[75] Inventor: Nicholas P. Cowley, Wiltshire, England

[73] Assignee: Plessey Overseas Limited, Ilford, England

[21] Appl. No.: 330,710

[22] Filed: Mar. 30, 1989

[30] Foreign Application Priority Data

Mar. 30, 1988 [GB] United Kingdom ............... 8727951

[51] Int. Cl.$^5$ ........................................... H03K 21/02
[52] U.S. Cl. ...................................... 377/47; 377/44; 377/52; 377/55
[58] Field of Search ................. 377/44, 47, 52, 55, 377/56

[56] References Cited

U.S. PATENT DOCUMENTS

| | | | |
|---|---|---|---|
| 4,084,082 | 4/1978 | Alfke | 377/52 |
| 4,184,068 | 1/1980 | Washburn | 377/52 |
| 4,423,381 | 12/1983 | Stepp et al. | 377/44 |
| 4,468,797 | 8/1984 | Shin | 377/47 |
| 4,633,194 | 12/1986 | Kikuchi et al. | 377/44 |
| 4,856,032 | 8/1989 | Klekotka et al. | 377/47 |

Primary Examiner—John S. Heyman
Attorney, Agent, or Firm—Fleit, Jacobson, Cohn, Price, Holman & Stern

[57] ABSTRACT

A dividing mechanism for use in frequency synthesizers: comprising:

a two modulus divider system having a first and second counter for providing respective programmable count totals A, M, and first counter being coupled to a dual modulus device providing moduli of n and n+1 whereby the two modulus divider system provides a division ratio of (Mn+A) for incoming signals:

first and second input means for receiving first and second programming number signals N, Q, synchronization means for receiving a strobe signal from a further counter which provides a count total P, and logic interface means responsive to said first and second input means and said synchronization means to provide programming number signals A, M to said two modulus divider system, the logic interface means being such that in the absence of said strobe signal the two modulus divider system provides a count total $C_1 = f(N)$, and following the reception of the strobe signal the two modulus divider system provides at least one count cycle with a count total $C_2 = f(N,Q)$, whereby if the output of the two modulus divider system is coupled to said external counter, said dividing mechanism provides a count total $C_3 = f(P,N,Q)$.

6 Claims, 2 Drawing Sheets

DIVIDING MECHANISMS FOR FREQUENCY SYNTHESIZERS

The present invention relates a dividing mechanism for frequency synthesisers, for example suitable for radio receivers, where they are commonly employed to synthesise a local oscillator signal.

Such frequency synthesisers are for example discussed in detail in "Radio Telecoms IC Handbook", Plessey, Mar. 1987, and commonly operate by comparing a reference frequency with a voltage controlled oscillator in a phase locked loop, the loop including a programmable divider device for generating the various local oscillator frequencies required for tuning to the various VHF channels, in the case of a VHF receiver. Various design compromises are necessary in regard to the design of the programmable divider device and it has been found that a "two modulus" or AM counter as shown in FIGS. 1A and 1B satisfies most requirements.

Referring to FIGS. 1A and 1B, there is shown a phase locked loop comprising an AM counter 2, a phase detector 4, loop filter 6 and voltage controlled oscillator 8. AM counter 2 includes independent counters A and M, each of which may be programmed with a count total A and M respectively. In operation counter A controls the modulus (N or N+1) of a two modulus prescaler divider 9 and counter M performs a bulk division operation.

Prescaler 9 receives a clock input and at the start of a count cycle divides in a ÷(N+1) condition. Counter A receives the output from prescaler 9 and counts up to its total A at which time its output switches prescaler 9 to count in a ÷N condition. For the remainder of the count cycle with counter M finishes its count, prescaler 9 remains in a ÷N condition.

Referring to FIG. 1B, the total divison of the synthesiser can be calculated as follows, where there values $t_{in}$, $t'$ and $t_{out}$ refer to the value of one cycle of operation at the nodal points indicated in FIG. 1A.

| For operation | $N_A < N_M$. |
| | $t' = M\ t_{out}$ |
| substituting for M | |
| | $t' = (M-A)\ t_{out} + A\ t_{out}$ |
| during A cycles | $t_{in} = (N + 1)t'$ |
| during M-A cycles | $t_{in} = N\ t'$ |

From these equations, it can be deduced:

| | $t_{in}$ = | (M-A) N + A (N + 1) |
| | $t_{out}$ = | MN − AN + AN + A |
| | = | MN + A |
| | total division T = | MN + A |

Example
N = 4
M = 1           M = 2                  M = 3
A = 0    T = 1 × 4 + 0 = 4     T = 4 × 2 + 0 = 8     T = 4 × 3 + 0 = 12
A = 1    T = 1 × 4 + 1 = 5     T = 4 × 2 + 1 = 9     T = 4 × 3 + 1 = 13
A = 2    N/A                   T = 4 × 2 + 2 = 10    T = 4 × 3 + 2 = 14
A = 3    N/A                   N/A                   T = 4 × 3 + 3 = 15
M = 4                          M = 5
A = 0    T = 4 × 4 + 0 = 16    T = 4 × 5 + 0 = 20
A = 1    T = 4 × 4 + 1 = 17
A = 2    T = 4 × 4 + 2 = 18
A = 3    T = 4 × 4 + 3 = 19
A = 4    T = 4 × 4 + 4 = 20

As may be seen, from the condition where M=3, A=0 the divisor T is integer steppable up to M=4, A=4.

Thus an important advantage of an AM counter is that the count total can be incremented in units of one over a wide range. This is important where all possible local oscillator frequencies are to be used for channel tuning purposes. However there is limit, known as the minimum division ratio, below which the divider is no longer "integer steppable". This ratio can be computed as $(N^2-N)$ and where a large modulus (N) is used, this ratio will mean that low integer steppable division ratios cannot be achieved.

This is disadvantageous since fast settling synthesisers necessarily require a high comparison frequency and since the minimum value of local oscillator frequency is determined by the division ratio multiplied by the reference frequency, a low frequency integer steppable local oscillator cannot be achieved.

Another problem which is common to this type of divider is the loop delay associated with the counter A, the feedback path to divider 9 and the internal modulus switching delay of divider 9. For correct operation this must occur within one cycle of the output of the divider 9 and so limits the minimum period at this point. Since the minimum period is determined by the division ratio N then the minimum N and hence minimum integer steppable division is limited so leading to a similar problem as above with the synthesised local oscillator.

It is an object of the present invention to adapt a dividing mechanism of the AM type as described above to overcome or reduce the above noted problems.

The present invention provides a dividing mechanism for use in frequency synthesisers comprising a two modulus divider system having a first and second counter for providing respective programmable count totals A, M, and first counter being coupled to a dual modulus device providing moduli of n and n+1 whereby the two modulus divider system provides a division ratio of (Mn+A) for incoming signals;

first and second input means for receiving first and second programming number signals N, Q, synchronisation means for receiving a strobe signal from a further counter which provides a count total P, and logic interface means responsive to said first and second input means and said synchronisation means to provide programming number signals A, M to said two modulus divider system, the logic interface means being such that in the absence of said strobe signal the two modulus divider system provides a count total $C_1 = f(N)$, and following the reception of the strobe signal the two modulus divider system provides at least one count cycle with a count total $C_2 = f(N,Q)$, whereby if the output of the two modulus divider system is coupled to said external counter, said dividing mechanism provides a count total $C_3 = f(P,N,Q)$.

In a preferred mode of operation the two modulus divider system normally provides a count total $C_1 = 2^N$, and when a strobe signal is received from the external counter the two modulus divider system provides a count $C_2 = 2^N + Q$.

Thus if the external counter has a counter total of P and provides a strobe signal upon reaching the $P^{th}$ count, the total count of the system is $C_3 = (P-1)2^N + 2^N + Q = P \times 2^N + Q$.

There are other modes of operating the dividing mechanism according to the invention as will become clear below.

However it will be noted the following advantages arise with the present invention.

Firstly the count total $C_3$ is a function of the external counter P and as preferred equals $P \times 2^N + Q$. Thus it is possible to have as large a count as desired (i.e. a low local oscillator frequency) by selecting an appropriately large external counter. Further it will be noted this maximum count is not dependent on the two modulus device (N/N+1) and hence it is possible to have a large maximum count while employing a low value for the two modulus device, e.g. N=4. A normal AM counter normally requires a large value of N because of the above cited reasons for the total count (MN+A). Thus the minimum count of the device, assuming there is no restriction on the values P, N and Q, will amount to the minimum count of the two modulus system which for N=4 is $(4^2 - 4) = 12$. Thus with the divider according to the invention, an integer steppable count is possible from a very low value to as large a number as desired.

The form of count total $2^N P + Q$ is convenient since the value of N determines the 'band' or range sector of the count, and P is a scaling factor for the band, enlarging the numbers available within the band. Q may be selected to provide all integers within the band up to the next value of $2^N$.

Thus for P=64, for N=1, a band is provided starting with 128 and extending as Q increases up to 255 at which the next band starts for N=2, Q=0 at 256.

Over and above this advantage, there is a significant advantage in accordance with the invention that the further counter may operate asynchronously with respect to the two modulus divider system. In one mode of operation, the further counter may receive the output of the two modulus divider system and provide a strobe signal output at the (P−1)th count to the interface means, where the strobe signal is not externally sychronised with the two modulus divider system and then undergo internal synchronisation such that for $P^{th}$ count of the further counter the two modulus divider system will count to the total $2^N + Q$. Hence design constraints are relaxed, and it is possible to provide the further counter as a counter external to the divider system according to the invention, which may be fabricated as a single chip.

A preferred embodiment of the invention will now be described with reference to the accompanying drawings, wherein.

Figure 1A:
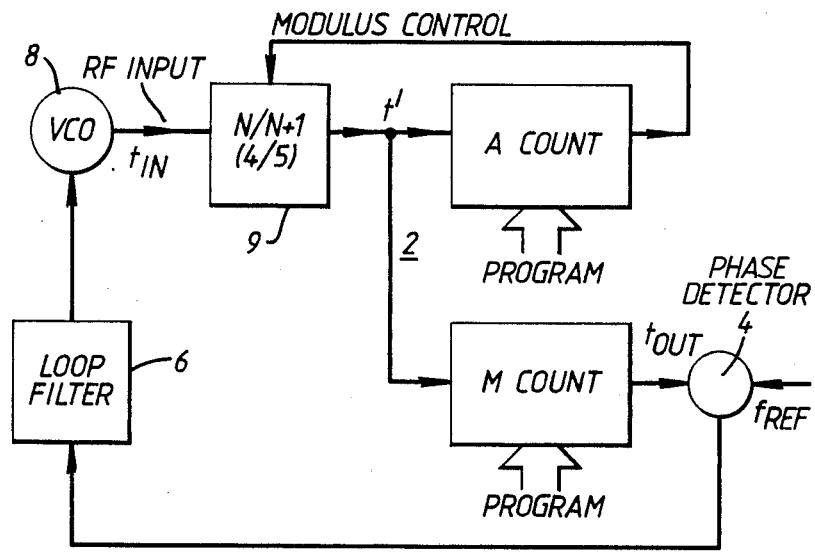
FIGS. 1A and 1B are a block diagram and a timing chart of a counter known as an AM synthesiser for use in the present invention.
Figure 1B:
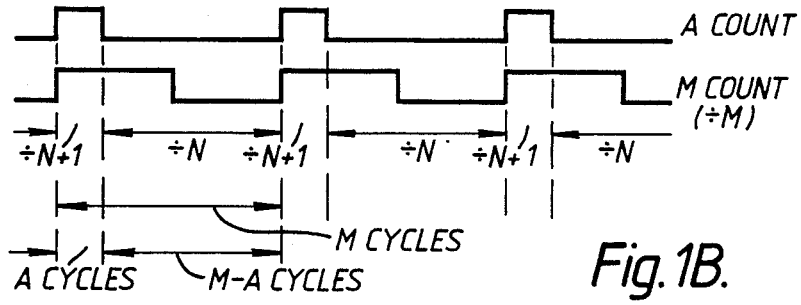
Figure 2:
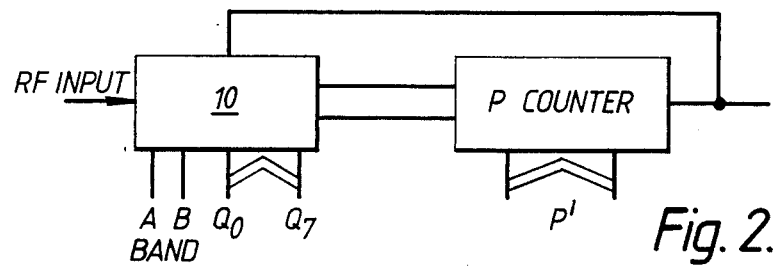
FIG. 2 is a block diagram of the counting mechanism according to the invention.
Figure 3:
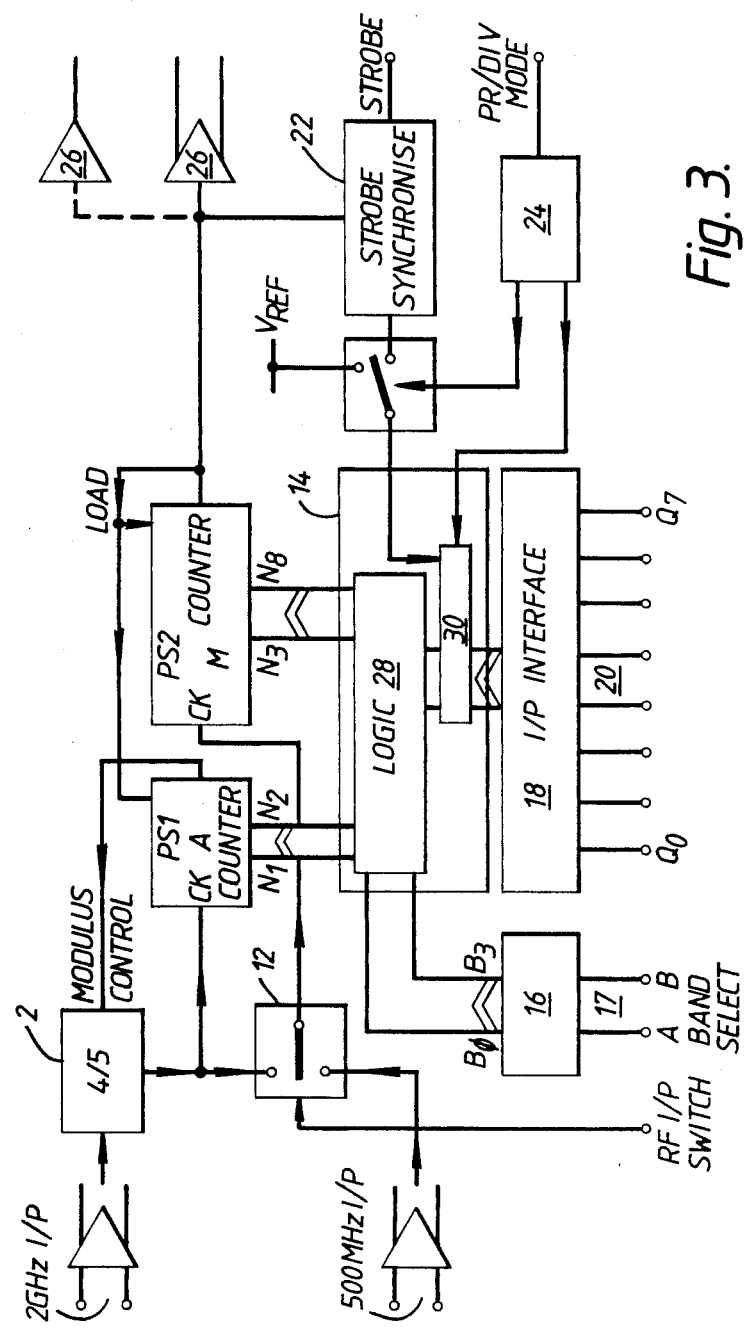
FIG. 3 is a circuit diagram of part of the mechanism of FIG. 1.

Referring now to FIGS. 2 and 3, the AM synthesiser of FIG. 1 is shown as forming part of a combined counter and logic circuit 10, shown in detail in FIG. 3, similar parts being denoted by similar reference numerals. Circuit 10 in practice is advantageously fabricated as an integrated circuit chip. The output of circuit 10 is connected to the input of a further counter P and the output of counter P is connected as a strobe input to circuit 10. Counter P may be programmed at a data input $P^1$ to a desired count total.

As shown in FIG. 3 circuit 10 comprises a prescaler 2 adapted to receive a 2 GHz clock, which is the carrier wave of an incoming signal. As an alternative, a 500 MHz clock may be provided via an RF input switch 12 to counter M, bypassing prescaler 2. The count total of counter A is determined by data inputs $N_1$, $N_2$ from a logic circuit 14, and the count total of counter M is determined by inputs $N_3 - N_8$ from logic circuit 14. Circuit 14 receives an input data signal from a band select circuit 16, which receives a band select number N from an input 17. Circuit 14 receives an input data signal from an input interface 18 which receives a number Q from an input 20. A strobe input is provided from strobe synchronise circuit 22 to logic circuit 14. A prescale/divide mode switch 24 provides control signals to circuit 14. The output of counter M provides an output at 26 from the circuit 10. Circuit 14 includes a gate array 28 for converting the programmed numbers N, Q into output numbers A, M, and a gate 30 under the control of STROBE and PR/DIV external signals for gating the programmed number Q to gate array 28.

In operation of the circuit of FIGS. 2 and 3, the division ratio as between the clock input to circuit 10 and the output of counter P amounts to $(2^N \times P + Q)$. It will be understood the circuit of FIGS. 2 and 3 will in operation be incorporated in a phase locked loop.

For (P−1) count cycles of circuit 10, the circuit counts to $2^N$. For the $P^{th}$ cycle, counter P provides an output signal to strobe circuit 22, whereby logic circuit 14 modifies the operation of the circuit to count to $(2^N+)$. Thus the total count over P cycles is $(2^N \times P + Q)$.

Thus for (P−1) count cycles, the two modulus divider system increments the P counter such that $4 \times M + A = 2^N$. for the Pth count cycle $4 \times M' + A' = 2^N + Q$ hence $Q = 4 \times (M' - M) + A' - A$     (1)

and $2^N = 4 \times M + A$     (2)

Thus the logic circuit 14 will be such to satisfy equations (1) and (2). Any suitable gate array 28 can implement the above equations.

In an alternative mode of operation, the mode switch 24 is operated so that in each cycle, the count mechanism counts to $2^N + Q$, giving a total of $P(2^N + Q)$.

Thus in accordance with the invention, in normal prescale mode of operation the device can be programmed to a band division ratio of $2^N$ and will count by this number until it receives a strobe signal when it then counts to $2^N + Q$ where Q is a number between 15 and 127. This enables the device to be cascaded with a further P counter to form a fully programmable counter of minimum count $2^{N_{min}} * P_{min}$ and maximum count of $(2^{N_{max}} * P_{max} + Q_{max})$ and every integral step there between.

The advantage of this system is the synchronous manner of programmable Q counting which enables the device to be cascaded with any P counter which generates a suitable strobe signal to form a large counter. With present systems each counter has to be uniquely designed for its specific application.

Although specifically described with reference to use in a frequency synthesiser, it will be understood that the dividing mechanism of the present invention may be employed in any application where there is a requirement for an "integer-steppable" count over a wide range which may be accurate synchronised with other elements of an electrical circuit. The invention is not therefore limited in its broadest aspect to frequency synthesis, although this is a particularly preferred application.

I claim:

1. A dividing mechanism, comprising:

A two modulus divider system having a first and second counter for providing respective programmable count totals A, M, and first counter being coupled to a dual modulus device providing moduli of n and n+1 whereby the two modulus divider system provides a division ratio of (Mn+A) for incoming signals;

first and second input means for receiving first and second programming number signals N, Q, synchronisation means for receiving a strobe signal from a further counter which provides a count total P, and logic interface means responsive to said first and second input means and said synchronisation means to provide programming number signals, A, M to said two modulus divider system, the logic interface means being such that in the absence of said strobe signal the two modulus divider system provides a count total $C_1 = f(N)$, and following the reception of the strobe signal the two modulus divider system provides at least one count cycles with a count total $C_2 = f(N,Q)$, whereby if the output of the two modulus divider system is coupled to said external counter, said dividing mechanism provides a count total $C_3 = f(P,N,Q)$.

2. A mechanism as claimed in claim 1 wherein said logic interface means is such that $C_1 = 2^N$, $C_2 = 2^N + Q$ and $C_3 = P \times 2^N + Q$.

3. A mechanism as claimed in claim 1 wherein said logic interface means includes a gate array coupled to receive the first programming number N, a gate responsive to a synchronisation signal from said synchronisation means for providing the second programming number Q to said gate array, wherein for (P−1) count cycles $(4 \times M + A) = 2^N$, and for the $P^{th}$ count cycle $(4 \times M' + A') = (2^N + Q)$.

4. A mechanism as claimed in claim 1, wherein said logic circuit includes a mode control switch for switching the circuit between the first mentioned mode and a mode in which said second version of the numbers are provided throughout the count cycles of the second counter whereby to provide a total $(2^N + Q) P$.

5. A mechanism as claimed in claim 1 wherein the dividing mechanism is employed as a programmable divider in a phase locked loop of a frequency synthesiser to derive a local oscillator signal from an incoming RF signal.

6. A mechanism as claimed in claim 1 wherein the dividing mechanism as set forth is fabricated on a single integrated circuit chip, and the further counter is fabricated externally to the integrated circuit chip.

* * * * *